United States Patent [19]

Naito et al.

[11] Patent Number: 5,051,712
[45] Date of Patent: Sep. 24, 1991

[54] LC FILTER

[75] Inventors: Yasuyuki Naito; Takeshi Azumi; Horishi Morii; Yoshiaki Kohno, all of Nagaokakyo, Japan

[73] Assignee: Murata Manufacturing Co., Ltd., Kyoto, Japan

[21] Appl. No.: 497,078

[22] Filed: Mar. 21, 1990

[30] Foreign Application Priority Data

Mar. 23, 1989 [JP] Japan ............................ 1-73570

[51] Int. Cl.⁵ ............................................. H03H 7/01
[52] U.S. Cl. ...................................... 333/185; 333/184; 336/200; 361/321
[58] Field of Search ............... 333/12, 181, 184, 185; 361/306 C, 321 F, 321 C, 321 R, 400–402; 336/200, 205, 206, 232

[56] References Cited

U.S. PATENT DOCUMENTS

| | | | |
|---|---|---|---|
| 4,573,101 | 2/1986 | Takeno | 333/185 X |
| 4,746,557 | 5/1988 | Sakamoto et al. | 333/184 X |
| 4,904,967 | 2/1990 | Morii et al. | 333/184 X |

FOREIGN PATENT DOCUMENTS 0068913  4/1982  Japan .................................... 333/12

*Primary Examiner*—Eugene R. Laroche
*Assistant Examiner*—Seung Ham
*Attorney, Agent, or Firm*—Wenderoth, Lind & Ponack

[57] ABSTRACT

A laminated chip-type LC filter for use as a noise filter is obtained by carrying out the following steps: dielectric layers are laminated on the top and bottom of a magnetic material layer, forming an inductor portion by providing conductive lines inside the magnetic material layer and forming capacitors by providing at least two layers of parallel internal electrodes inside both of the dielectric layers. External electrodes are provided at both ends of the inductor portion. Intermediate external electrodes are provided at both lateral sides in the middle part of the dielectric layers and the magnetic layer. The inductor portion is connected to the external electrodes. The internal electrodes are connected to the intermediate external electrodes and to the external electrodes, respectively. By making the intermediate external electrode the ground, the internal electrodes are grounded so that stray capacitance does not arise between the internal electrodes thus causing less deterioration of the insertion loss characteristic in the high-frequency area.

5 Claims, 3 Drawing Sheets

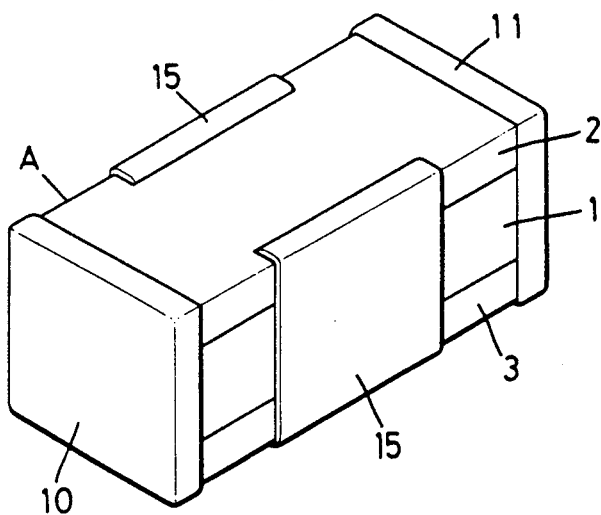
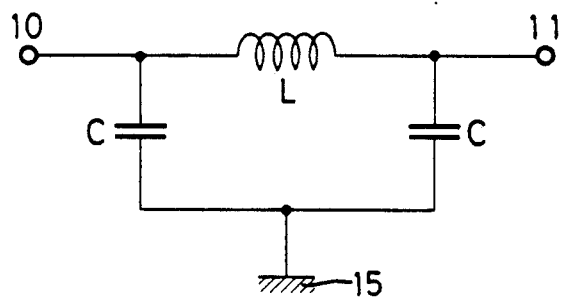
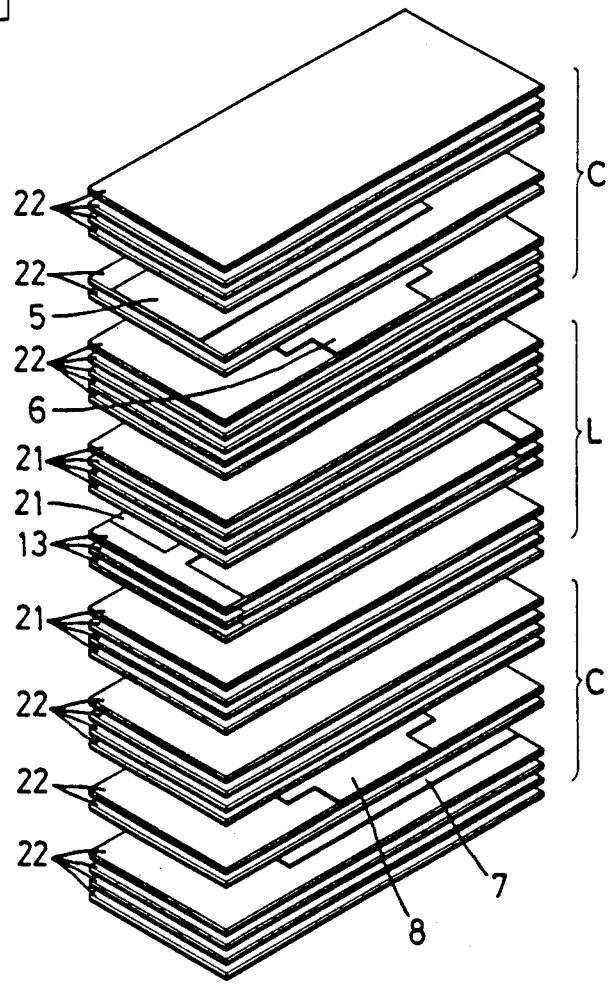

LC FILTER

BACKGROUND OF THE INVENTION

1. Field of the Invention

This invention relates to a laminated chip-type LC filter suitably used as a noise filter, for example, for EMI and the like.

2. Description of the Related Art

Conventionally, a noise filter has been so constructed that an inductor L and capacitors C are assembled into an L-type, π-type or T-type in order to raise impedance against noise, or to bypass a component of noise to ground.

There are two types of conventional LC filters; one is the type in which separate parts serving as inductor L and capacitors C are connected together, and the other is the laminated chip-type filter.

The laminated chip-type LC filter has a filter body, obtained by sintering integrally laminated members comprising magnetic material green sheets and dielectric green sheets to form magnetic material and dielectric sections, external electrodes at both ends thereof, a ground on at least one of upper and lower surfaces thereof, a conductive layer connected to the external electrodes at both ends thereof and located within the above-described magnetic material, and internal electrodes having respective ends thereof connected to the external electrodes and located within the dielectric section opposite the ground.

The LC filter, in which separate parts serving as inductor L and capacitors C are connected together, poses problems in that it is relatively large, exhibits low mounting density when fixed to a printed substrate, and moreover, requires much assembly time in its manufacture.

In addition, another problem occurs in that, when a lead terminal connected to the ground is longer than necessary, the noise elimination effect is remarkably deteriorated due to lead inductance thereof.

In the laminated chip-type LC filter, problems having occurred in the LC filter of the former type are obviated, but stray capacitance between both terminals of the chip has reduced considerably the high-frequency characteristic thereof.

SUMMARY OF THE INVENTION

Accordingly, an object of this invention is to provide an LC filter in which electronic components, constituting the above-described LC circuit, are chip-like and miniaturized, and in which an inductance component, especially the stray capacitance in the lead terminal, is reduced to thereby prevent deterioration of the high-frequency characteristic.

In order to achieve the above-described object, a filter according to the present invention is manufactured by carrying out a method consisting of the following steps: on the top and bottom of the magnetic material layer are laminated the dielectric layers; an inductor portion of conductive lines is provided inside said magnetic material layer; said magnetic material layer and dielectric layers are provided at both ends thereof with external electrodes; to the external electrodes at ends thereof is connected the above-described inductor portion; at least two layers of parallel internal electrodes are provided within respective upper and lower dielectric layers described above; said dielectric layers and magnetic material layer have intermediate external electrodes extending to both lateral sides in the middle part thereof, respectively; the internal electrodes in respective dielectric layers, upper and lower, at the side of the magnetic material layer, are connected to the intermediate external electrodes; and, the internal electrodes remote from the magnetic material layer are connected to the external electrodes at both ends of the filter.

Also, in the above-described magnetic material layer, the conductive lines may be coil-shaped.

In the LC filter according to the present invention, the magnetic material layer constitutes an inductor and the dielectric layers the capacitors, as described above.

This LC filter has the external electrodes thereof, provided at both ends of magnetic material layer and dielectric layers, connected to a signal line; and the intermediate external electrodes, provided at both lateral sides in the middle part of the respective layers, are connected to ground, to thereby constitute a π-type noise filter.

In this case, the internal electrodes provided inside the upper and lower dielectric layers and at the side of the magnetic material layer are connected to ground, respectively, so that stray capacitance does not arise between the internal electrode in the upper dielectric layer and the internal electrode in the lower dielectric layer, with the result that stray capacitance does not arise between either of the terminals of chip.

Thus, an LC filter can be obtained having less deteriorated high-frequency characteristics.

BRIEF DESCRIPTION OF THE DRAWINGS

FIG. 4 is a perspective view of the LC filter, FIG. 5 is an equivalent circuit of the LC filter, FIG. 6 is a perspective view of green sheets before sintering.

DETAILED DESCRIPTION OF THE PREFERRED EMBODIMENTS

The embodiments of the present invention will now be described below with reference to the accompanying drawings.

Figure 1:
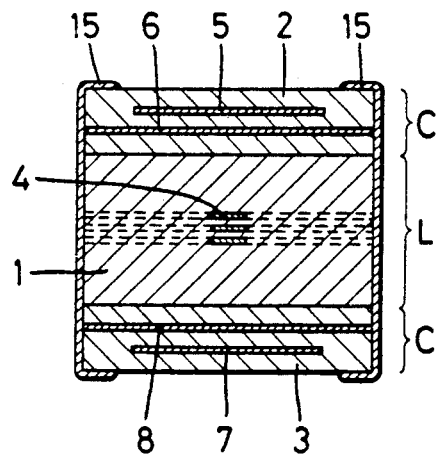
FIG. 1 is a transverse cross-sectional view of a first embodiment of the LC filter according to the present invention.
Figure 2:
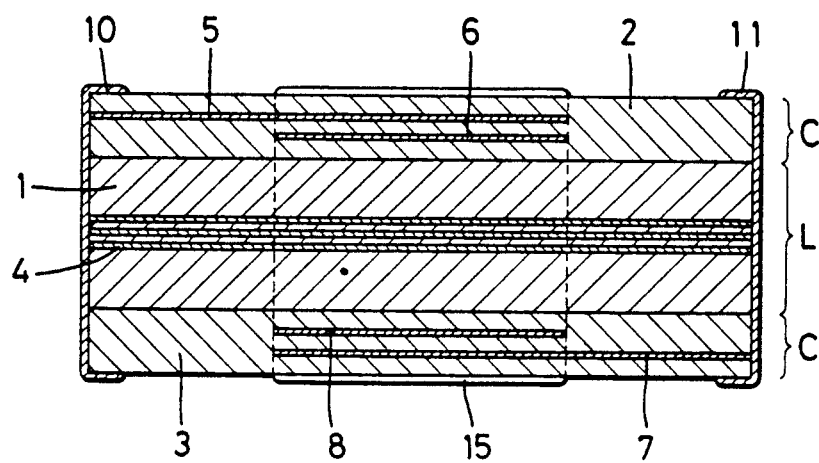
FIG. 2 is a longitudinal sectional view of the LC filter.
Figure 3:
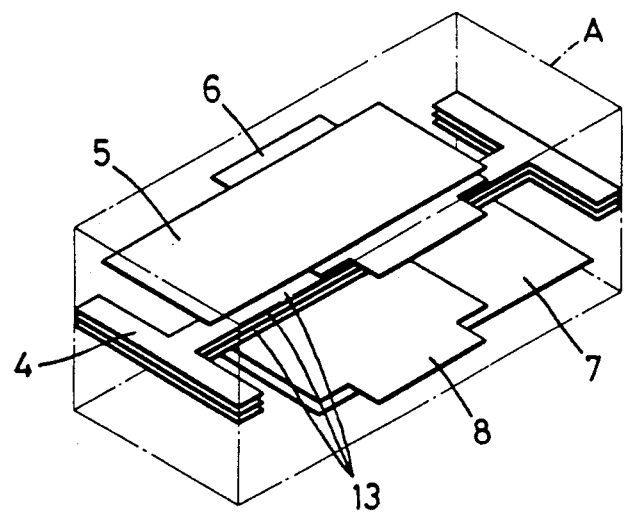
FIG. 3 is a perspective view showing internal conductive lines and internal electrodes of the filter body.

In FIGS. 1 and 2, numeral 1 designates a magnetic material layer, and 2 and 3 upper and lower dielectric layers.

At the central part of the above-described magnetic material layer 1 is formed the inductor portion 4 consisting of three layers of conductive lines extending to both ends of the inductor. Inductance of the LC filter itself is set subject to the cross-sectional area and length of the conductive lines of inductor portion 4 and to the permeability of the magnetic material layer 1.

Within the upper dielectric layer 2 is provided the internal electrode 5, at a location remote from the magnetic material layer 1, and which electrode 5 extends only to the left end of dielectric layer 2 in the figures.

The internal electrode 6 is provided between magnetic material layer 1 and the right end of electrode 5 and does not extend to both ends of dielectric layer 2 but does to both sides thereof. Likewise, within the lower dielectric layer 3 is provided the internal electrode 7, at a location remote from the magnetic material layer 1, and which electrode 7 extends only to the right end of dielectric layer 3. Furthermore, the internal electrode 8 is provided between magnetic material 1 and the left end of electrode 7 and does not extend to both ends of dielectric layer 3 but does to both sides thereof.

LC filter capacity is set subject to the permittivity of the above-described dielectric layers 2, 3, and the area over which the internal electrodes 5, 6 and 7, 8 are opposed.

In addition, said magnetic material layer 1 and said dielectric layers 2, 3 are provided at both ends thereof with external electrodes 10, 11, the internal electrode 5 being connected at the left end thereof to the external electrode 10 and the internal electrode 7 being connected at the right end thereof to the external electrode 11.

The above-described inductor portion 4 is provided with, for example, three layers of conductive lines 13 extending to both ends of the magnetic material layer 1, to thereby connect both ends thereof to the external electrodes 10, 11.

The body A, consisting of the above-described magnetic material layer 1 and dielectric layers 2, 3, is provided in the middle part at both lateral sides thereof with intermediate external electrodes 15, respectively. Both sides of the internal electrodes 6, 8 are connected to said intermediate external electrodes 15, as shown in FIG. 4.

Thus, the laminated chip-type LC filter has the equivalent circuit shown in FIG. 5.

FIG. 6 is a perspective view showing green sheets in the above-described embodiment, in which reference numeral 21 designates magnetic material green sheets consisting of magnetic material having a composition of 0.17 NiO+0.30 ZnO+0.5 CuO +0.48 Fe$_2$O$_3$.

On the surface of the green sheet 21 is printed an Ag-Pd paste to form the above-described conductive line 13.

Numeral 22 designates dielectric green sheets consisting of dielectric material having a composition of 0.5 Pb(Mg$_{\frac{1}{3}}$Nb$_{\frac{2}{3}}$)O$_3$+0.5 Pd(Mg$_{\frac{1}{2}}$W$_{\frac{1}{2}}$)O$_3$. Ag-Pd paste is printed on these green sheets 22 to thereby form internal electrodes 5,6 and 7, 8 described above.

Subsequently, a plurality of the green sheets 21 having the conductive lines 13 thereon are sandwiched in a vertical direction between a plurality of green sheets 21 not having conductive lines thereon. And, moreover, on the top and bottom thereof are laminated a plurality of green sheets 22 without internal electrodes and a plurality of green sheets 22 with internal electrodes 5, 6 and 7, 8. The entire body thus obtained is pressed under a pressure of 1 ton/cm$^2$, is cut into an appropriate size, and is then sintered for 2 hours at a temperature of 1,000° C. to obtain the above-described body A.

A dip technique is used to form external electrodes 10, 11 at both ends of the body A described above and an offset technique is used to form intermediate external electrodes 15, followed by baking for 20 minutes at 800° C.

Figure 7:
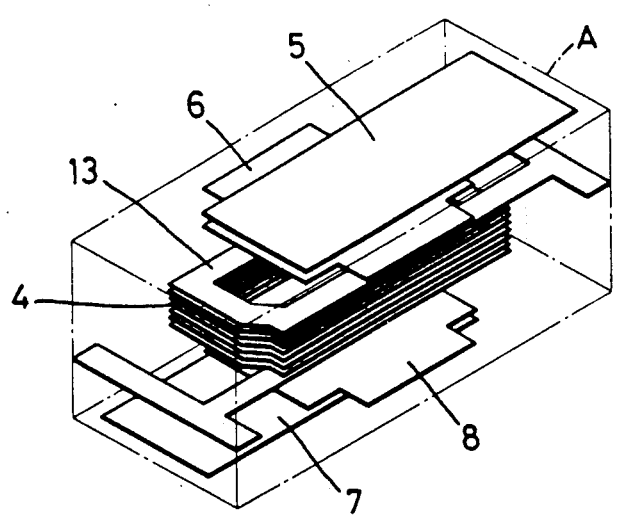
FIG. 7 is a perspective view of a second embodiment in which the conductive lines are coil-shaped.

The second embodiment shown in FIG. 7 has conductive lines 13 which are coil-shaped, and the other parts are the same as those in the first embodiment shown in FIG. 1 through FIG. 6.

In order to illustrate the advantages of the present invention, two comparative examples differing from the present invention were tested as described below.

Figure 8:
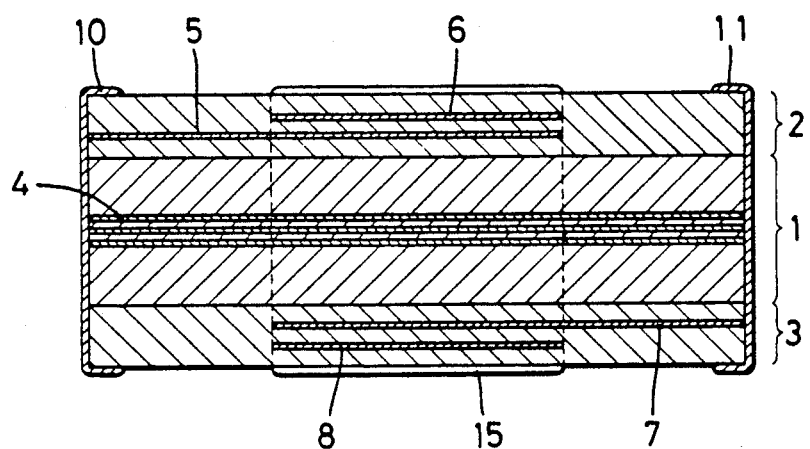
FIG. 8 and FIG. 9 are longitudinal sectional views of comparative examples differing from the present invention.

FIG. 8 shows comparative example 1 in which the inner electrodes 5, 7 of the dielectric layers 2, 3 are superposed adjacent the magnetic material layer, and the internal electrodes 6, 8 are disposed opposite thereto.

Figure 9:
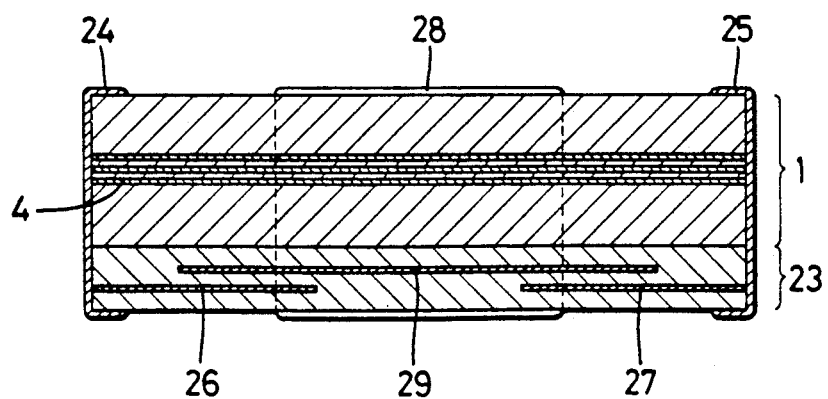

Likewise, FIG. 9 shows comparative example 2 in which the dielectric layer 23 is laminated only at the lower surface of magnetic material layer 1 which is identical to that of the respective embodiments described above. Within the dielectric layer are provided internal electrodes 26, 27 connected to the external electrodes 24, 25 at both ends thereof. An internal electrode 29 is connected to intermediate external electrodes 28.

The table below shows insertion loss of the LC filter when a signal is applied to the external electrodes and the intermediate external electrode is grounded, the measurements being carried out in respective LC filters of the first embodiment of the present invention, the comparative example 1 and the comparative example 2.

| Frequency (MHz) | 10 | 20 | 50 | 100 | 200 | 500 | 1000 |
| --- | --- | --- | --- | --- | --- | --- | --- |
| Present Invention | 0.3 | 3 | 23 | 40 | 54 | 60 | 42 |
| Comparative Example 1 (other than present invention) | 0.2 | 3 | 22 | 40 | 48 | 37 | 31 |
| Comparative Example 2 (other than present invention) | 0.3 | 3 | 22 | 41 | 41 | 25 | 16 |

As is evident from the table above showing the measurements, the LC filter according to the present invention has a remarkably improved characteristic of insertion loss in the high-frequency area compared to the comparative examples 1 and 2.

It is assumed that the above result was obtained because stray capacitance formed between the two internal electrodes connected to the external electrodes is considerably reduced due to the existence of the external electrodes connected to ground, whereby a noise filter effectively functioning for EMI and the like is obtained.

What is claimed is:

1. A $\pi$-type LC filter comprising:
   a laminate of a middle layer of magnetic material, an upper layer of dielectric material disposed over an upper surface of said middle layer, and a lower layer of dielectric material disposed over a lower surface of said middle layer opposite said upper surface thereof,
   the laminate constituting a filter body having opposite ends and opposite sides extending between said ends;
   external end electrodes disposed over the ends of said filter body, respectively;
   at least one external intermediate electrode disposed over a portion of said filter body intermediate said ends thereof;
   at least one line of electrically conductive material extending within said layer of magnetic material and electrically connected to said external end electrodes, whereby said layer of magnetic material and said at least one line of electrically conductive material extending therein form an inductor of the π-type LC filter;

a first pair of capacitor electrodes extending within said upper layer of dielectric material parallel to one another, one of the electrodes of said first pair being remote from said layer of magnetic material and electrically connected to one of said external end electrodes, and the other of the electrodes of said first pair being disposed adjacent said layer of magnetic material and electrically connected to said at least one external intermediate electrode, whereby said first pair of capacitor electrodes and said upper layer of dielectric material form a capacitor of the π-type LC filter; and a second pair of capacitor electrodes extending within said lower layer of dielectric material parallel to one another, one of the electrodes of said second pair being remote from said layer of magnetic material and electrically connected to the other of said external end electrodes, and the other of the electrodes of said second pair being adjacent said layer of magnetic material and electrically connected to said at least one external intermediate electrode, whereby said second pairs of capacitor electrodes and said lower layer of dielectric material form another capacitor of the π-type LC filter.

2. A π-type LC filter as claimed in claim 1, wherein said at least one electrically conductive line of material includes a coil-shaped line of electrically conductive material.

3. A method of manufacturing a π-type LC filter, said method comprising the steps of:

providing a layer of magnetic material;

laminating an upper layer of dielectric material over an upper surface of the layer of magnetic material and a lower layer of dielectric material over a lower surface of the layer of magnetic material opposite said upper surface, to form a laminated filter body having opposite ends and opposite sides extending between said ends;

disposing external end electrodes over the ends of the filter body, respectively;

disposing at least one external intermediate electrode over a portion of the filter body intermediate the ends thereof;

forming at least one line of electrically conductive material within the layer of magnetic material, and electrically connecting the at least one line of electrically conductive material to the external end electrodes, so as to form an inductor of the π-type LC filter;

forming a first pair of capacitor electrodes within the upper layer of dielectric material so as to extend parallel to one another with one of the electrodes of said first pair being remote from the layer of magnetic material and the other of the electrodes of said first pair being adjacent the layer of magnetic material, electrically connecting said one of the electrodes of said first pair to one of the external end electrodes, and electrically connecting said other of the electrodes of said first pair to the at least one external intermediate electrode, so as to form a capacitor of the π-type LC filter; and forming a second pair of capacitor electrodes within the lower layer of dielectric material so as to extend parallel to one another with one of the electrodes of said second pair being remote from the layer of magnetic material and the other of the electrodes of said second pair being adjacent the layer of magnetic material, electrically connecting said one of the electrodes of said second pair to the other of the external end electrodes, and electrically connecting said other of the electrodes of said second pair to the at least one external intermediate electrode, so as to form another capacitor of the π-type LC filter.

4. A method of manufacturing a π-type LC filter as claimed in claim 3, wherein the step of forming at least one line of electrically conductive material comprises forming a coil-shaped line of electrically conductive material.

5. A method of manufacturing π-type LC filter as claimed in claim 3, wherein the steps of providing a layer of magnetic material and forming at least one line of electrically conductive material therein comprise printing an electrically conductive paste on the surface of a sheet of magnetic material to form said line of electrically conductive material, and sandwiching said sheet between other sheets of magnetic material which do not have lines of electrically conductive material formed thereon, and the steps of providing the layers of dielectric material and forming the pairs of capacitor electrodes therein comprise printing an electrically conductive paste on two sheets of dielectric material to form a respective said pair of capacitor electrodes, and sandwiching said two sheets between other respective sheets of dielectric material which do not have electrodes formed thereon.

* * * * *